US 7,417,368 B2

United States Patent
Wu et al.

(10) Patent No.: US 7,417,368 B2
(45) Date of Patent: Aug. 26, 2008

(54) COLOR ELECTROLUMINESCENT DISPLAYS WITH THICK FILM DIELECTRIC LAYER BETWEEN ELECTRODES

(75) Inventors: Xingwei Wu, Brampton (CA); Abdul M. Nakua, Mississauga (CA)

(73) Assignee: Ifire Technology Corp., Fort Saskatchewan, Alberta (CA)

( * ) Notice: Subject to any disclaimer, the term of this patent is extended or adjusted under 35 U.S.C. 154(b) by 173 days.

(21) Appl. No.: 10/686,850

(22) Filed: Oct. 16, 2003

(65) Prior Publication Data

US 2004/0135495 A1   Jul. 15, 2004

Related U.S. Application Data

(60) Provisional application No. 60/476,644, filed on Jun. 9, 2003, provisional application No. 60/419,118, filed on Oct. 18, 2002.

(51) Int. Cl.
*H05B 33/00* (2006.01)
*H05B 33/02* (2006.01)

(52) U.S. Cl. .............. 313/503; 313/504; 313/509; 428/690; 428/917

(58) Field of Classification Search .......... 313/498, 313/503
See application file for complete search history.

(56) References Cited

U.S. PATENT DOCUMENTS

| | | | |
|---|---|---|---|
| 4,286,959 | A | 9/1981 | Horn et al. |
| 5,294,869 | A | 3/1994 | Tang et al. |
| 5,294,870 | A | 3/1994 | Tang et al. |
| 5,401,616 | A | 3/1995 | Isomi et al. |
| 5,432,015 | A | 7/1995 | Wu et al. |
| 5,525,377 | A | 6/1996 | Gallagher et al. |
| 5,537,000 | A * | 7/1996 | Alivisatos et al. ........... 313/506 |
| 5,559,057 | A | 9/1996 | Goldstein |
| 5,670,839 | A | 9/1997 | Noma et al. |
| 5,909,081 | A * | 6/1999 | Eida et al. .................... 313/504 |
| 5,920,429 | A | 7/1999 | Burns et al. |
| 5,932,327 | A | 8/1999 | Inoguchi et al. |
| 5,949,188 | A | 9/1999 | Leising et al. |
| 6,099,979 | A | 8/2000 | Inoguchi et al. |
| 6,137,459 | A | 10/2000 | Eida et al. |
| 6,177,529 | B1 | 1/2001 | Razavi et al. |

(Continued)

FOREIGN PATENT DOCUMENTS

EP         272760   A1 *   6/1988

(Continued)

OTHER PUBLICATIONS

T. Shimoda, et al., 26.3: "Multicolor Pixel Patterning of Light-Emitting Polymers by Ink-Jet Printing", Society for Information Display 99 Digest, ISSN0099, 1999, pp. 376-379.

(Continued)

*Primary Examiner*—Sikha Roy
(74) *Attorney, Agent, or Firm*—Fay Sharpe LLP

(57) ABSTRACT

The present invention is directed to color electroluminescent displays comprising a novel sub-pixel structure and method for making the same. The sub-pixel structure has an electroluminescent phosphor, which emits blue light, and a photoluminescent phosphor, which emits at least one other color as a result of absorption of the blue light. The invention is also directed to novel photoluminescent phosphor materials.

58 Claims, 4 Drawing Sheets

U.S. PATENT DOCUMENTS

| | | | |
|---|---|---|---|
| 6,207,077 | B1 | 3/2001 | Burnell-Jones |
| 6,358,652 | B1 | 3/2002 | Tomiuchi et al. |
| 6,469,435 | B1 * | 10/2002 | Seibold et al. ............... 313/493 |
| 6,576,930 | B2 | 6/2003 | Reeh et al. |
| 6,608,439 | B1 | 8/2003 | Sokolik et al. |
| 6,771,019 | B1 * | 8/2004 | Wu et al. .................... 313/503 |
| 2002/0043926 | A1 | 4/2002 | Takahashi et al. |
| 2002/0122895 | A1 | 9/2002 | Cheong et al. |

FOREIGN PATENT DOCUMENTS

| | | |
|---|---|---|
| EP | 0 550 063 A2 | 7/1993 |
| EP | 1 215 946 A | 6/2002 |
| JP | 2004-152749 | 5/2004 |
| WO | WO 99/16847 | 4/1999 |
| WO | WO 00/70917 | 11/2000 |
| WO | WO 2004/032576 A1 * | 4/2004 |

OTHER PUBLICATIONS

C. Hosokawa, et al., L2.3: "Organic Multicolor EL Display with Fine Pixels", Society for Information Display 97 Digest, ISSN0097, 1997, pp. 1073-1076.

C. B. Murray, D. J. Norris and M. G. Bawendi, "Synthesis and characterization of nearly monodispers CdE(E=S, Se, Te) semiconductor nanocrystallites," Journal American Chemical Society, 115 (1993), pp. 8706-8715.

R. Mach and G. O. Mueller, "Physics and technology of thin film electroluminescent displays", Semiconductor Science and Technology, Institute of Physics, London, GB, vol. 6, No. 5, May 1, 1991, pp. 305-323 XP 000208039.

F. L. Arbeloa, et al., "Relations between photophysical and lasing properties of rhodamines in solid polymeric matrices", Applied Physics B, vol. 64, Springer-Verlag 1997, pp. 651-657 XP-002277461.

A. Costela, et al., "Solid-state dye laser based on Coumarin 540A-doped polymeric matrices", Optics Communications, North-Holland Publishing Co., Amsterdam, NL., vol. 130, No. 1, Sep. 15, 1996, pp. 44-50, XP004008827.

F. Amat-Guerri, et al., "Laser action from a rhodamine 640-doped copolymer of 2-hydroxyethyl methacrylate and methyl methacrylate", Optics Communications, North-Holland Publishing Co., Amsterdam, NL., vol. 114, No. 5, Feb. 15, 1995, pp. 442-446, XP004014404.

* cited by examiner

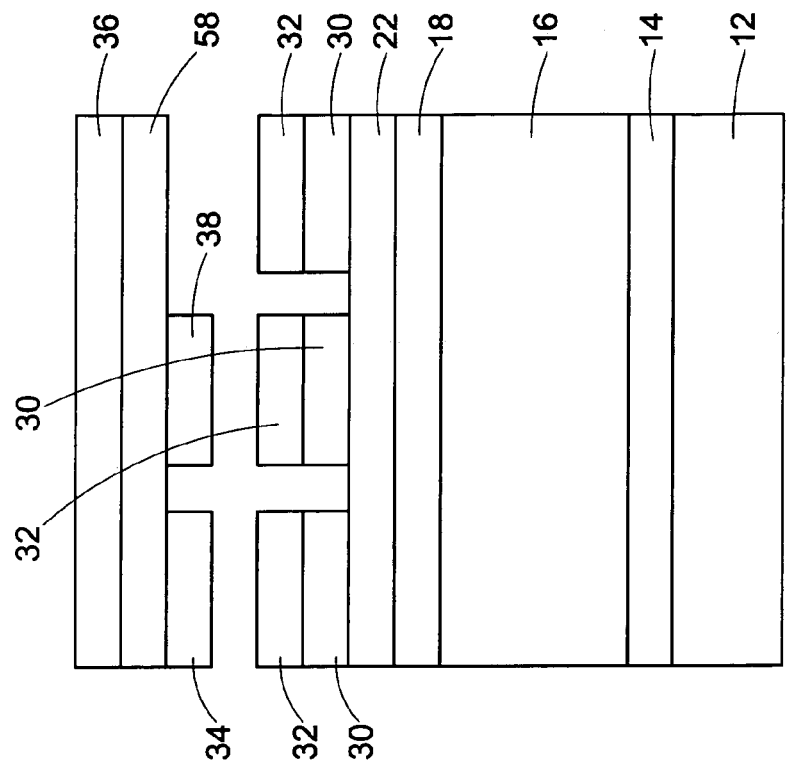
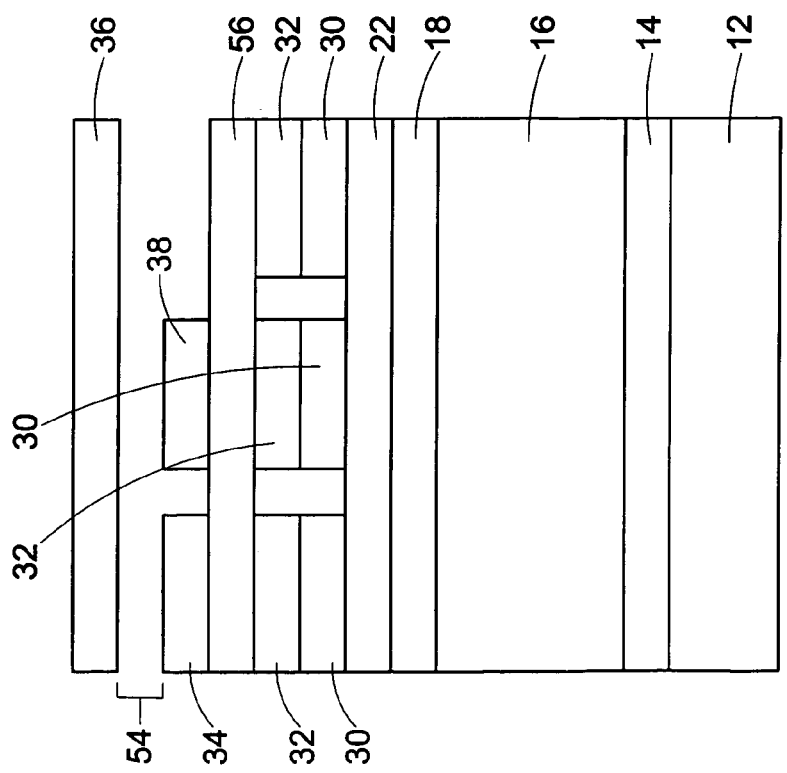

COLOR ELECTROLUMINESCENT DISPLAYS WITH THICK FILM DIELECTRIC LAYER BETWEEN ELECTRODES

This application claims the benefit of U.S. Provisional patent application Ser. No. 60/419,118, filed Oct. 18, 2002 and U.S. Provisional patent application Ser. No. 60/476,644, filed Jun. 9, 2003.

FIELD OF THE INVENTION

The present invention relates to a color electroluminescent display. More specifically, the invention relates to a color electroluminescent display wherein direct electroluminescent emission produces blue light and photoluminescent emission, initiated by absorption of the blue light, produces at least one other color.

BACKGROUND TO THE INVENTION

Thick film dielectric electroluminescent displays have been developed and are described, for example, in Applicant's U.S. Pat. No. 5,432,015 (the entirety of which is incorporated herein by reference). These thick film dielectric electroluminescent displays provide for superior resistance to dielectric breakdown as well as a reduced operating voltage compared to thin film electroluminescent (TFEL) displays. A thick film dielectric structure deposited on a ceramic substrate withstands higher processing temperatures and facilitates annealing of phosphor films at higher temperatures to improve their luminosity. With these advantages and, with recent advances in blue-emitting phosphor materials, such displays have achieved the luminosity and color coordinates required to achieve the technical performance of traditional cathode ray tube (CRT) displays. Nevertheless, further improvement is desirable to simplify adjustment of the display color balance, to facilitate maintenance of the proper color balance of the display over its operating life and to simplify the process used to manufacture the displays to reduce cost.

Cerium-activated strontium sulphide phosphor materials are traditionally used in electroluminescent displays for blue color, while manganese-activated zinc sulphide materials are employed for red and green colors. The optical emission from these phosphor materials must be passed through an appropriate chromatic filter to achieve the necessary color coordinates for red, green and blue sub-pixels, resulting in a loss of luminance and energy efficiency. The manganese-activated zinc sulphide phosphor has a relatively high electrical to optical energy conversion efficiency of up to about 10 lumens per Watt of input power while a cerium-activated strontium sulphide phosphor has an energy conversion efficiency of 1 lumen per Watt, which is relatively high for blue emission. Optical filters must be used with these phosphors because the spectral emission for these phosphors is quite wide, with spectral emission for the zinc sulphide-based phosphor material spanning the color spectrum from green to red and that for the strontium sulphide-based material spanning the range from blue to green. The spectral emission of the cerium-activated strontium sulphide phosphor can be shifted to some degree towards the blue by controlling the deposition conditions and activator concentration, but not to the extent required to eliminate the need for an optical filter.

Blue light emitting phosphor materials have been developed having narrower emission spectra. These phosphor materials include europium-activated barium thioaluminate compounds which provide good blue color coordinates. The stability of europium activated barium thioaluminate phosphor materials has been further improved by judicious addition of oxygen to the phosphor during phosphor film processing, as disclosed in Applicant's co-pending International Patent Application PCT/CA03/00568 filed Apr. 17, 2003 (the disclosure of which is incorporated herein in its entirety). This improvement facilitates blue phosphor life which commensurates with commercial requirements, but still allows for a decrease in the blue light luminance to 50% of its initial value over the operating life. This decrease, relative to the decrease in the luminance of red and green electroluminescent phosphors, must be taken into account in maintaining the desired color balance of an electroluminescent display over its operating life. In general, the luminance of the red, green and blue electroluminescent phosphors that make up the sub-pixels of the display decrease at different rates and result in a shift in the color balance of the display as it ages. This shift can be compensated, to some extent, by the driving circuitry. For instance, if the rates of luminance decay of the different colors are predictable, or if sensors are incorporated to measure the sub-pixel luminance at different points in the display life, adjustments to the driving voltages to the sub-pixels can be made. These measurements, however, add complexity and cost to the manufacture and operation of the display.

In addition, each red, green and blue electroluminescent phosphor in a display will each have a specific threshold voltage whereby each begins to luminesce. These specific threshold voltages must each be carefully matched to each individual phosphor to minimize display power consumption. If these voltages are not matched properly, the brightness ratios between red, green and blue will be incorrect. Such matching requires precise control over the thickness and composition of the phosphor and adjacent dielectric layers within the display to the extent that manufacturing yield may be compromised.

The process of forming a patterned phosphor structure used to define individual sub-pixels for a color electroluminescent display is described in Applicant's International Patent Application WO 00/70917 (the disclosure of which is incorporated herein in its entirety). The patterning process requires photolithographic processes involving photoresist deposition, exposure, phosphor film etching and phosphor film lift-off processes for each sub-pixel phosphor material, which involves many successive steps and leads to relatively high manufacturing costs. The chemicals used in such photolithographic processes have to be carefully purified and their use carefully controlled to avoid damage to the typically moisture-sensitive phosphor materials during the patterning process, which can also add to the cost of display manufacture.

Colour organic light emitting diode (OLED) displays are known and described, for example, in the following references: T. Shimoda et al., Society for Information Display 99 Digest, pp 376-80; U.S. Patent Application 2002/0043926; C. Hosokawa et al., Society for Information Display 97 Digest pp 1073-6, and U.S. Pat. No. 6,608,439. The OLED described in U.S. Pat. No. 6,608,439 uses semiconductor nanocrystal layer or layers to produce different colours. OLEDs, however, cannot be used to build a passive matrix, large area display having many rows of pixels with a reasonable luminance. This limitation may be mitigated to some extent by using active matrix addressing, but the thin film transistor (TFT) array needed for active matrix addressing is, in itself, difficult to scale up and costly for large area displays with a large number of addressable rows.

U.S. Pat. No. 5,670,839 describes an electroluminescent device that utilizes photoluminescent materials to convert ultraviolet light to visible light. The conversion efficiency for converting ultraviolet light is relatively low. In addition, ultraviolet light tends to degrade the display.

It is therefore highly desirable to provide a color electroluminescent display in a cost effective and operationally effective manner that obviates the shortcomings of the prior art.

SUMMARY OF THE INVENTION

In accordance with one aspect of the present invention, there is provided a pixel sub-structure for a thick film dielectric electroluminescent display, the pixel sub-structure comprising:

at least two sub-pixels, each sub-pixel comprising a blue light emitting electroluminescent inorganic phosphor layer; and at least one photoluminescent phosphor layer, each photoluminescent phosphor layer being associated with a respective one of the sub-pixels such that the blue light emitted by each respective one of the sub-pixels is substantially absorbed by the associated photoluminescent phosphor layer thereby causing the photoluminescent phosphor layer to emit a colored light other than the blue light.

In accordance with another aspect of the present invention, the pixel sub-structure comprises a plurality of photoluminescent phosphor layers, each photoluminescent phosphor layer being associated with a different one of the sub-pixels.

In accordance with another aspect of the present invention, the pixel sub-structure comprises three sub-pixels.

In accordance with another aspect of the present invention, there is provided a pixel sub-structure for a thick film dielectric electroluminescent display, the pixel sub-structure comprising:

two sub-pixels, each sub-pixel comprising a blue light emitting electroluminescent inorganic phosphor layer; and a photoluminescent phosphor layer, the photoluminescent phosphor layer being associated with one of the sub-pixels such that the blue light emitted by that sub-pixel is substantially absorbed by the photoluminescent phosphor layer thereby causing the photoluminescent phosphor layer to emit a colored light other than the blue light.

In accordance with a further aspect of the present invention, there is provided a pixel sub-structure for a thick film dielectric electroluminescent display, the pixel sub-structure comprising:

three sub-pixels, each sub-pixel comprising a blue light emitting electroluminescent inorganic phosphor layer; and a first photoluminescent phosphor layer associated with one of the sub-pixels such that the blue light emitted by that sub-pixel is substantially absorbed by the first photoluminescent phosphor layer thereby causing the first photoluminescent phosphor layer to emit a colored light other than the blue light; and a second photoluminescent phosphor layer associated with an other one of the sub-pixels such that the blue light emitted by that sub-pixel is substantially absorbed by the second photoluminescent phosphor layer thereby causing the second photoluminescent phosphor layer to emit a colored light other than the blue light and the colored light of the first photoluminescent phosphor layer.

In accordance with another aspect of the present invention, the pixel sub-structure further comprises at least one other photoluminescent phosphor layer associated with at least one of each said photoluminescent phosphor layer associated with the respective one of the sub-pixels.

In accordance with a further aspect of the present invention, each sub-pixel comprises a viewing side electrode associated with the blue light emitting electroluminescent inorganic phosphor layer.

In accordance with another aspect of the present invention, the photoluminescent phosphor layer is disposed on the viewing side electrode. The photoluminescent phosphor layer may also be disposed on an optically transparent barrier layer and the optically transparent barrier layer is disposed on the viewing side electrode.

In accordance with a further aspect of the present invention, the pixel sub-structure further comprises at least one reflecting layer associated with the photoluminescent phosphor layer. Preferably, one reflecting layer is disposed over the surface of the photoluminescent phosphor layer opposite to the viewing side electrode such that longer wavelength light is transmitted and the blue light is reflected back to the photoluminescent phosphor layer. More preferably, an additional reflecting layer is on the other surface of the photoluminescent phosphor layer such that substantially all of the light is reflected back to the photoluminescent phosphor layer.

In accordance with yet a further aspect of the present invention, the pixel sub-structure further comprises at least one optical filter associated with the photoluminescent phosphor layer such that the filter inhibits the photoluminescent phosphor layer from substantially absorbing blue ambient light.

In accordance with another aspect of the present invention, the photoluminescent phosphor layer comprises at least one dye, at least one dye in a matrix component, at least one photoluminescent powder, at least one photoluminescent powder in a matrix component, or mixtures thereof.

In accordance with another aspect of the present invention, the photoluminescent phosphor layer is an insulating material with a band gap having an energy less than that of a photon of the blue light emitted.

In accordance with a further aspect of the present invention, at least one thin dielectric layer is on at least one surface of the blue light emitting electroluminescent phosphor layer.

In accordance with another aspect of the present invention, the pixel sub-structure further comprises a transparent cover plate, wherein the photoluminescent phosphor layer is adhered thereto. If necessary, the photoluminescent phosphor layer is coated with an optically transparent passivating layer.

In accordance with another aspect of the present invention, the pixel sub-structure further comprises a thin optically transparent sheet disposed over the sub-pixels, the at least one photoluminescent phosphor layer being adhered to one side of the optically transparent sheet opposite to the sub-pixels, a transparent cover plate being disposed over the thin optically transparent sheet such that an air gap is formed between the optically transparent sheet and the transparent cover plate, with the at least one photoluminescent phosphor layer therebetween.

In accordance with yet another aspect of the present invention, the pixel sub-structure further comprises a thin optically transparent sheet disposed over the viewing side electrodes, the at least one photoluminescent phosphor layer being adhered to one side of the optically transparent sheet opposite to the viewing side electrodes, a transparent cover plate being disposed over the optically transparent sheet such that an air gap is formed between the optically transparent sheet and the transparent cover plate, with the at least one photoluminescent phosphor layer therebetween.

In accordance with another aspect of the present invention, there is provided a thick film dielectric electroluminescent display having pixels, each pixel comprising a thick dielectric layer associated with a pixel sub-structure, the pixel sub-structure comprising:

at least two sub-pixels, each sub-pixel emitting blue light; and at least one photoluminescent phosphor layer, each photoluminescent phosphor layer being associated with a respective one of the sub-pixels such that the blue light emitted by each respective one of the sub-pixels is substantially absorbed by the associated photoluminescent phosphor layer thereby causing the photoluminescent phosphor layer to emit a colored light other than the blue light.

In accordance with another aspect of the present invention, there is provided a thick film dielectric electroluminescent display having pixels, each pixel comprising a thick dielectric layer associated with a pixel sub-structure, the pixel sub-structure comprising:

two sub-pixels, each sub-pixel emitting blue light; and a photoluminescent phosphor layer, the photoluminescent phosphor layer being associated with one of the sub-pixels such that the blue light emitted by that sub-pixel is substantially absorbed by the photoluminescent phosphor layer thereby causing the photoluminescent phosphor layer to emit a colored light other than the blue light.

In accordance with another aspect of the present invention, there is provided a thick film dielectric electroluminescent display having pixels, each pixel comprising a thick dielectric layer associated with a pixel sub-structure, the pixel sub-structure comprising:

three sub-pixels, each sub-pixel emitting blue light; and a first photoluminescent phosphor layer associated with one of the sub-pixels such that the blue light emitted by that sub-pixel is substantially absorbed by the first photoluminescent phosphor layer thereby causing the first photoluminescent phosphor layer to emit a colored light other than the blue light; and a second photoluminescent phosphor layer associated with an other one of the sub-pixels such that the blue light emitted by that sub-pixel is substantially absorbed by the second photoluminescent phosphor layer thereby causing the second photoluminescent phosphor layer to emit a colored light other than the blue light and the colored light of the first photoluminescent phosphor layer.

In accordance with another aspect of the present invention, there is provided a thick film dielectric electroluminescent display having pixels, each pixel having comprising a thick dielectric layer associated with a pixel sub-structure, the pixel sub-structure comprising:

a blue light emitting electroluminescent phosphor layer;

at least two viewing side electrodes associated with the blue emitting electroluminescent phosphor layer; and at least one photoluminescent phosphor layer, each photoluminescent phosphor layer being associated with a respective one of the viewing side electrodes such that the blue light emitted by the electroluminescent phosphor layer is substantially absorbed by the associated photoluminescent phosphor layer thereby causing the photoluminescent phosphor layer to emit a colored light other than the blue light.

In accordance with another aspect of the present invention, there is provided a thick film dielectric electroluminescent display having pixels, each pixel comprising a thick dielectric layer associated with a pixel sub-structure, the pixel sub-structure comprising:

a blue light emitting electroluminescent phosphor layer;

two viewing side electrodes associated with the blue emitting electroluminescent phosphor layer; and a photoluminescent phosphor layer, the photoluminescent phosphor layer being associated with one of the viewing side electrodes such that the blue light emitted by the electroluminescent phosphor layer is substantially absorbed by the photoluminescent phosphor layer thereby causing the photoluminescent phosphor layer to emit a colored light other than the blue light.

In accordance with another aspect of the present invention, there is provided a thick film dielectric electroluminescent display having pixels, each pixel comprising a thick dielectric layer associated with a pixel sub-structure, the pixel sub-structure comprising:

a blue light emitting electroluminescent phosphor layer;

three viewing side electrodes associated with the blue emitting electroluminescent phosphor layer;

a first photoluminescent phosphor layer associated with one of the viewing side electrodes such that the blue light emitted by the electroluminescent phosphor layer is substantially absorbed by the first photoluminescent phosphor layer thereby causing the first photoluminescent phosphor layer to emit a colored light other than the blue light; and a second photoluminescent phosphor layer associated with an other one of the viewing side electrodes such that the blue light emitted by the electroluminescent phosphor layer is substantially absorbed by the second photoluminescent phosphor layer thereby causing the second photoluminescent phosphor layer to emit a colored light other than the blue light and the colored light of the first photoluminescent phosphor layer.

In accordance with yet a further aspect of the present invention, there is provided a thick film dielectric electroluminescent display having pixels, each pixel comprising, in sequence:

a substrate;

a row electrode;

a thick dielectric layer; and a pixel sub-structure as described above.

In accordance with another aspect of the present invention, there is provided a thick film dielectric electroluminescent display having pixels, each pixel comprising, in sequence:

a substrate;

a row electrode;

a thick dielectric layer; and a pixel sub-structure comprising:

three sub-pixels, each sub-pixel emitting blue light, a first photoluminescent phosphor layer associated with one of the three sub-pixels such that the blue light emitted by that sub-pixel is substantially absorbed by the first photoluminescent phosphor layer thereby causing the first photoluminescent phosphor layer to emit red light; and a second photoluminescent phosphor layer associated with an other one of the three sub-pixels such that the blue light emitted by that sub-pixel is substantially absorbed by the second photoluminescent phosphor layer thereby causing the second photoluminescent phosphor layer to emit green light.

In accordance with another aspect of the present invention, there is provided a method of making a pixel sub-structure as described above for a thick film dielectric electroluminescent display, the method comprising:

disposing each photoluminescent phosphor layer over a respective one of the sub-pixels such that the blue light emitted by each respective one of the sub-pixels is substantially absorbed by the associated photoluminescent phosphor layer thereby causing the photoluminescent phosphor layer to emit a colored light other than the blue light.

In accordance with another aspect of the present invention, there is provided a method of making a pixel sub-structure as described above for a thick film dielectric electroluminescent display, the method comprising:

disposing a first photoluminescent phosphor layer over one of the sub-pixels such that the blue light emitted by that sub-pixel is substantially absorbed by the first photoluminescent phosphor layer thereby causing the first photoluminescent phosphor layer to emit a colored light other than the blue light; and disposing a second photoluminescent phosphor layer over an other one of the sub-pixels such that the blue light emitted by that sub-pixel is substantially absorbed by the second photoluminescent phosphor layer thereby causing the second photoluminescent phosphor layer to emit a colored light other than the blue light and the colored light of the first photoluminescent phosphor layer.

In accordance with another aspect of the present invention, there is provided a method further comprising disposing a transparent cover plate over the sub-pixels and adhering the photoluminescent phosphor layer thereto.

In accordance with another aspect of the present invention, there is provided a method further comprising coating the photoluminescent phosphor with an optically transparent passivating layer.

In accordance with another aspect of the present invention, there is provided a method further comprising disposing at least two viewing side electrodes over the blue emitting electroluminescent phosphor layer.

In accordance with another aspect of the present invention, there is provided a method further comprising the step of disposing a transparent cover plate over the viewing side electrodes and adhering the photoluminescent phosphor layer thereto.

In accordance with another aspect of the present invention, there is provided a method further comprising coating the photoluminescent phosphor with an optically transparent passivating layer.

In accordance with another aspect of the present invention, there is provided a method further comprising disposing at least one reflecting layer on at least one surface of the photoluminescent phosphor layer.

In accordance with another aspect of the present invention, there is provided a method further comprising disposing at least one optical filter over the photoluminescent phosphor layer such that the filter inhibits the photoluminescent phosphor layer from substantially absorbing blue ambient light.

In accordance with another aspect of the present invention, the invention is particularly adaptable to the use of an electroluminescent display employing a thick dielectric layer having a high dielectric constant, whereby the radiative emission from the blue electroluminescent phosphor can be significantly increased over that used in a conventional thin film electroluminescent display structure.

In accordance with another aspect of the present invention, a full color ac thick film dielectric electroluminescent display is provided that incorporates three sub-pixels, each having an electroluminescent phosphor layer that emits blue light, and wherein two of the three sub-pixels each have an overlying photoluminescent phosphor layer. One photoluminescent phosphor layer emits red light and the other green light upon excitation by the light emitted by the blue electroluminescent phosphor. The red and green light intensity can be controlled by controlling the blue light emission intensity.

In accordance with a further aspect of the present invention, there is provided a color thick film dielectric electroluminescent display that comprises at least two sub-pixels providing different colors for each pixel. The display comprises an electroluminescent phosphor that emits light at a frequency corresponding to the sub-pixel with the shortest wavelength light and independently controllable sub-pixels to reach the desired color for each pixel.

In accordance with another aspect of the present invention, the display further comprises phosphor layers associated with at least one sub-pixel that are able to emit light at a longer wavelength than the blue emitting light of the electroluminescent phosphor layer.

In accordance with another aspect of the present invention, there is provided at least one overlying photoluminescent phosphor layer for at least one sub-pixel of each pixel with the property that it substantially absorbs the short wavelength light from the electroluminescent phosphor layer so that light substantially generated from the photoluminescent phosphor layer only is emitted.

In accordance with another aspect of the present invention, there is provided a photoluminescent phosphor material for emissive displays, the material comprising:

a pigment powder comprising a solid solution of organic photoluminescent molecules; and a matrix material, wherein the pigment powder is dispersed in the matrix material, the matrix material being chemically and physically compatible with the pigment powder such that the photoluminescent efficiency of the organic photoluminescent molecules are substantially maintained.

The photoluminescent phosphor material is used in an emissive display, such as a thick film dielectric electroluminescent display, an organic light emitting diode display (OLED), a liquid crystal display or a plasma display.

In accordance with another aspect of the present invention, there is provided a pixel sub-structure as described above wherein the photoluminescent phosphor layer is a photoluminescent phosphor material for emissive displays, the material comprising:

a pigment powder comprising a solid solution of organic photoluminescent molecules; and a matrix material, wherein the pigment powder is dispersed in the matrix material, the matrix material being chemically and physically compatible with the pigment powder such that the photoluminescent efficiency of the organic photoluminescent molecules are substantially maintained.

In accordance with yet another aspect of the present invention, there is provided a method for making a photoluminescent phosphor material, the method comprising mixing a pigment powder and a matrix material to provide a uniform dispersion of the pigment powder in the matrix material, wherein the pigment material comprises a solid solution of organic photoluminescent molecules, the matrix material being chemically and physically compatible with the pigment powder such that the photoluminescent efficiency of the organic photoluminescent molecules are substantially maintained.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from the detailed description.

BRIEF DESCRIPTION OF THE DRAWINGS

A preferred embodiment of the present invention will now be described more fully with reference to the accompanying drawing:

FIG. 4 is a plan view of a thick film dielectric electroluminescent display of yet another embodiment of the present invention.

FIG. 5 is a plan view of a thick film dielectric electroluminescent display of a further embodiment of the present invention.

DETAILED DESCRIPTION OF THE INVENTION

Figure 1:
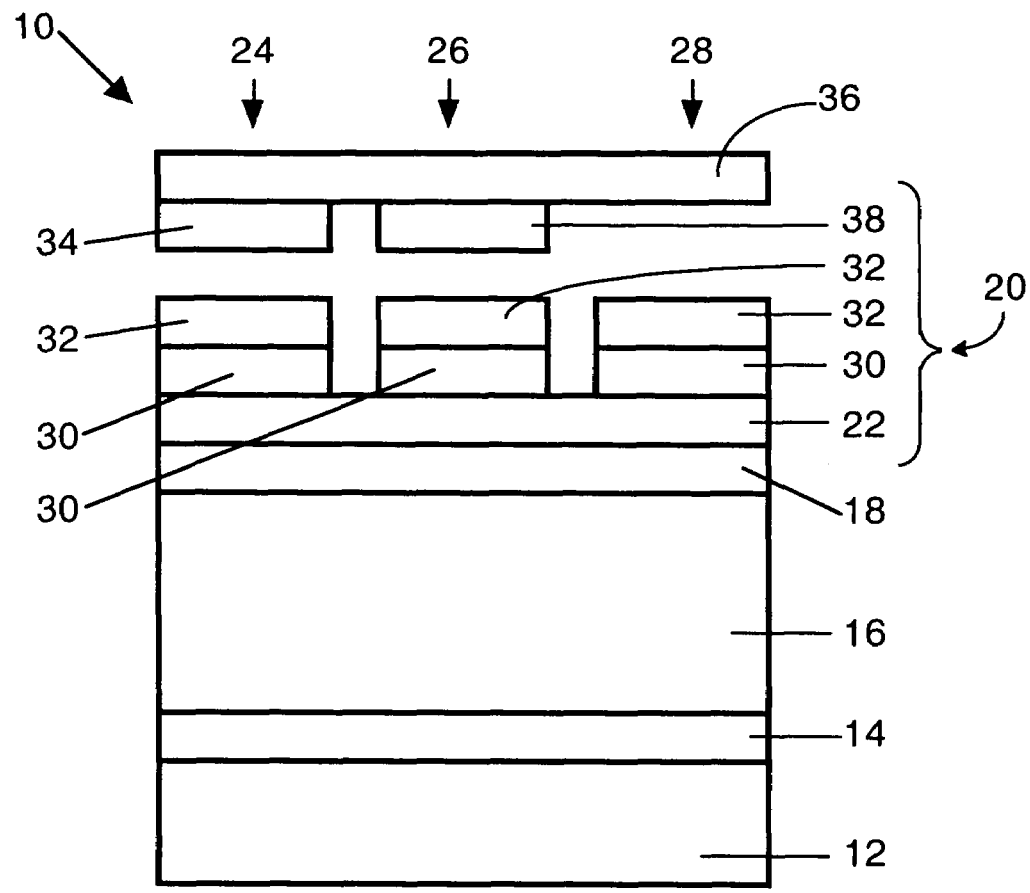
FIG. 1 is a plan view of a thick film dielectric electroluminescent display of an embodiment of the present invention.

The present invention is directed to electroluminescent displays or devices incorporating direct electroluminescent emission, which produces blue light, and photoluminescent emission, initiated by absorption of the blue light, which produces at least one other color.

In an embodiment of the invention is a pixel sub-structure for an electroluminescent display. The pixel sub-structure comprises at least one photoluminescent phosphor layer and at least two sub-pixels with each of the sub-pixels emitting blue light. Each photoluminescent phosphor layer is associated with a respective one of the sub-pixels such that the blue light emitted by each respective one of the sub-pixels is substantially absorbed by the associated photoluminescent phosphor layer thereby causing the photoluminescent phosphor layer to emit a colored light other than the blue light. It is preferred that the electroluminescent phosphor layer is a blue light emitting electroluminescent phosphor layer, which is associated with at least two viewing side electrodes and at least one photoluminescent phosphor layer. Each photoluminescent phosphor layer is associated with a respective one of the viewing side electrodes such that the blue light emitted by the electroluminescent phosphor layer is substantially absorbed by the associated photoluminescent phosphor layer thereby causing the photoluminescent phosphor layer to emit a colored light other than the blue light.

The colored light emitted by the photoluminescent phosphor layer(s) of the pixel sub-structures have a distribution of wavelengths longer than those for blue light, which are preferably red or green. The pixel sub-structures are then incorporated into thick film dielectric electroluminescent displays. In particular, the thick film dielectric electroluminescent displays have a number of pixels. Each pixel comprises the pixel sub-structure.

Preferably, the pixel sub-structure is a set of two or three sub-pixels that emit blue light. The threshold voltage of the sub-pixels, which is the voltage at which the sub-pixel begins to luminesce, will, therefore, be equal since the sub-pixels are identical. The threshold voltage can be determined by measuring the sub-pixel's luminance versus an increasing applied voltage to determine the voltage at which luminance begins to occur. For a full color ac thick film dielectric electroluminescent display, there may be three sub-pixels for red, green and blue light emission, wherein each sub-pixel has a blue emitting electroluminescent phosphor that emits blue light and wherein the red and green sub-pixels have an overlying photoluminescent phosphor layer that emits red and green light when it is excited by the light emitted by the blue emitting electroluminescent phosphor.

For a simpler color ac thick film dielectric electroluminescent display, there may be two sub-pixels, wherein each sub-pixel has a blue emitting electroluminescent phosphor that emits blue light and wherein one sub-pixel has an overlying photoluminescent phosphor layer that emits a color at a longer wavelength than blue light when it is excited by the light emitted by the blue emitting electroluminescent phosphor. The intensity of the photoluminescent phosphor layers are controlled by varying the blue light emission intensity of the electroluminescent phosphor.

Referring to the drawing, FIG. 1, there is illustrated an electroluminescent device 10 incorporating a pixel sub-structure 20, in accordance with a preferred embodiment of the present invention. The electroluminescent device 10, has a substrate 12 on which is located a row electrode 14, followed by a thick film dielectric layer 16 and then a thin film dielectric layer 18. The pixel sub-structure 20 is located on the thin film dielectric layer 18. The pixel sub-structure comprises a blue-emitting electroluminescent phosphor layer 22 that comprises europium activated barium thioaluminate. The electroluminescent phosphor layer 22 is deposited using a process as described in Applicant's co-pending International Patent Application PCT/CA03/00568 filed Apr. 17, 2003 (the disclosure of which is herein incorporated in its entirety). The pixel sub-structure 20 further comprises three sub-pixel columns, 24, 26 and 28, located thereon. Sub-pixel columns 24, 26 and 28 each have a thin film dielectric layer 30 located on the electroluminescent phosphor layer 22 and each have a viewing side electrode 32 located on each thin film dielectric layer 30.

The configuration of the thin film dielectric layers 30 and the viewing side electrodes 32 are referred to as patterned. Each thin film dielectric layer 30 may comprise the same or different material. Each viewing side electrode 32 may comprise the same or different material. The pixel sub-structure 20 further comprises photoluminescent phosphor layers. In this embodiment, the photoluminescent phosphor layers are a photoluminescent red-emitting dye layer 34 deposited on the under side of a transparent cover plate 36 and aligning with the sub-pixel column 24 and a photoluminescent green-emitting dye layer 38 deposited on the under side of the transparent cover plate 36 and aligning with the sub-pixel column 26.

A continuous thin film dielectric layer may also be deposited over the electroluminescent phosphor layer 22 instead of having three individual thin film dielectric layers 30, as shown in FIG. 1. The thin film dielectric layer is, therefore, not patterned in this particular embodiment.

Figure 3:
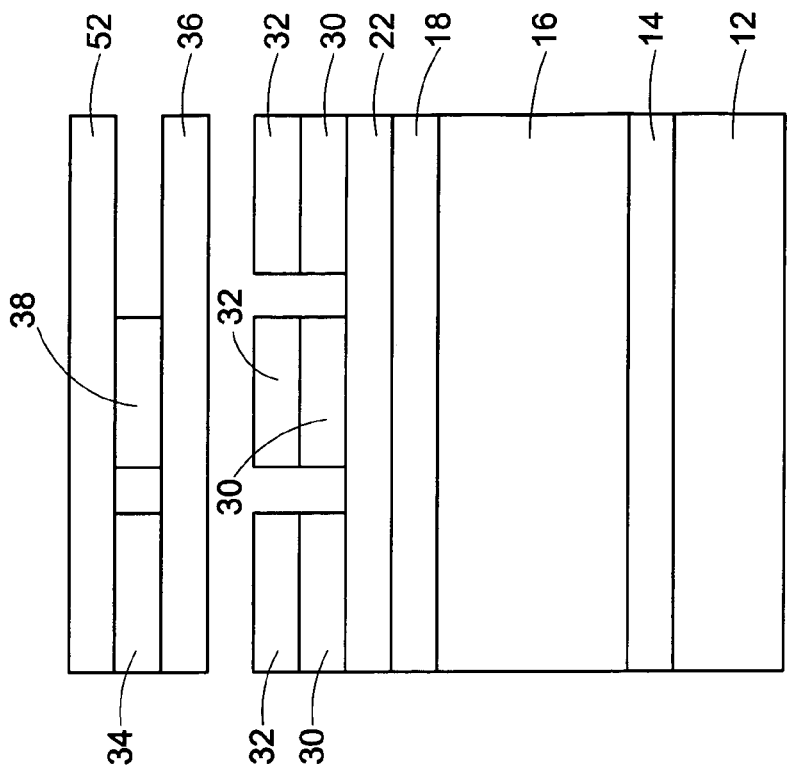
FIG. 3 is a plan view of a thick film dielectric electroluminescent display of still another embodiment of the present invention.

The dye layers 34 and 38 may be deposited on the under-side of the transparent cover plate 36, as shown in FIG. 1, or alternatively, the dye layers 34 and 38 may be deposited on the top of the cover plate 36. When deposited on top of the cover plate 36, as shown in FIG. 3, the dye layers 34 and 38 may be protected from the ambient atmosphere with the use of a coating of an optically transparent passivating layer 52. This is advantageous since this allows light that is emitted from the dyes to be transmitted directly from the dye layers 34 and 38 to air or a medium with an optical index of refraction near unity rather than through the transparent cover plate 36. This prevents light from being transmitted within the transparent cover plate 36 by multiple internal reflection due to the higher optical index of refraction of the transparent cover plate as compared to air. The overall effect is to improve the display luminance, improve the display contrast and minimize colour bleeding from one sub-pixel to adjacent sub-pixels. Optically transparent passivating layers are known.

Figure 2:
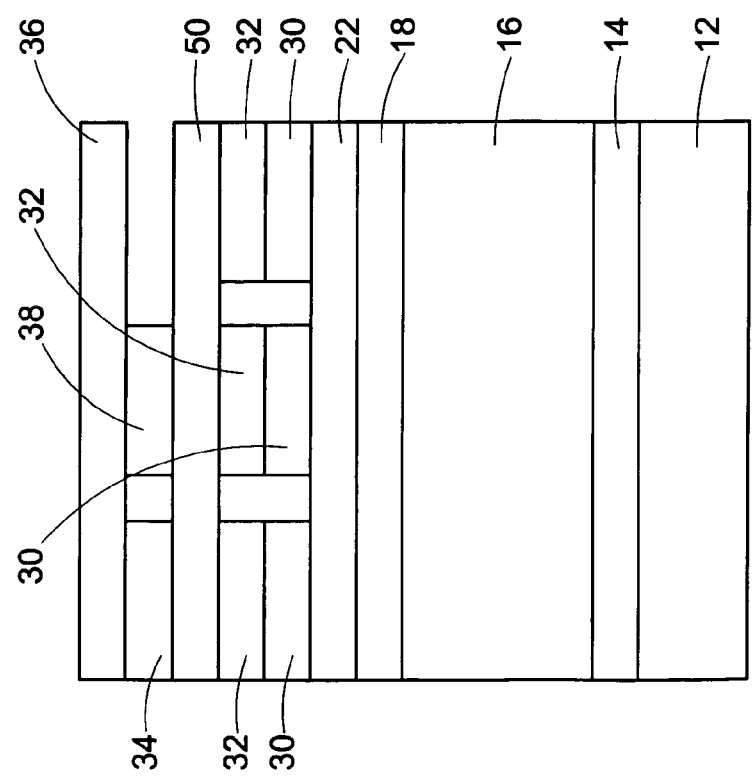
FIG. 2 is a plan view of a thick film dielectric electroluminescent display of another embodiment of the present invention.

Alternatively, the photoluminescent red-emitting dye layer 34 may be directly disposed onto the viewing side electrode 32 of column 24 and the photoluminescent green-emitting dye layer 38 directly onto the viewing side electrode 32 of column 26. It is preferred that, in this embodiment as shown in FIG. 2, the viewing side electrode 32 is made of an inert material to prevent any potential reaction of the dye layers 34 and 38 with the viewing side electrode 32. An optically transparent barrier layer 50 of an inert material can be disposed between the viewing side electrodes 32 and the deposited dye layers 34 and 38 to prevent any potential reaction of the dye layers 34 and 38 with the viewing side electrode 32. Optically transparent barrier layers are known.

In a further embodiment as shown in FIG. 4, a thin optically transparent sheet 56 is disposed over the sub-pixels. The photoluminescent red emitting dye layer 34 and the photoluminescent green emitting dye layer 38 are deposited in a suitable pattern on a side of the thin optically transparent sheet opposite to the side facing the sub-pixels. The transparent cover plate 36 is disposed over the optically transparent sheet, with the dye layers 34 and 38 deposited thereon, such that there is an air gap 54 between the optically transparent sheet and the transparent cover plate 36. This helps prevent loss of luminance, contrast and colour bleeding due to transmission of light along the thin optically transparent sheet. It also allows fabrication of the patterned photoluminescent phosphor layer separately from fabrication of the underlying sub-pixel structure, thus improving manufacturing yield since an error in the photoluminescent phosphor patterning process does not result in loss of the remainder of the sub-pixel structure, which has substantially higher value than the patterned photoluminescent phosphor layer. Some examples of materials that may be used for thin optically transparent sheets may be any transparent plastics that are inert and are non- distortable, such as Mylar®.

Figure 6:
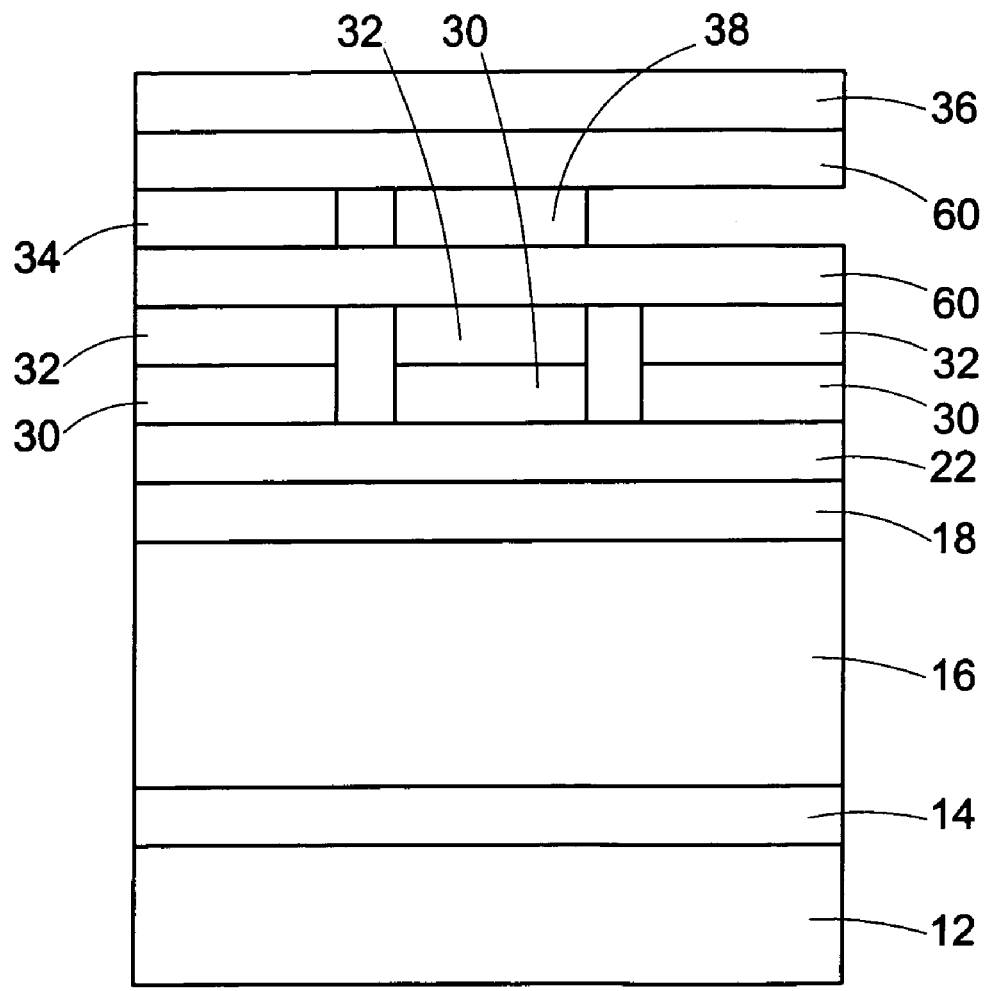
FIG. 6 is a plan view of a thick film dielectric electroluminescent display of a still further embodiment of the present invention.

In other embodiments as shown in FIG. 6, the photoluminescent phosphor layer (i e. the photoluminescent red-emitting dye layer 34 and the photoluminescent green-emitting dye layer 38) has, on at least one surface and, preferably on both surfaces, a reflecting layer 60. The reflecting layer is capable of reflecting any blue light that is not initially absorbed by the photoluminescent phosphor layer such that the blue light is substantially absorbed by the photoluminescent phosphor layer. In other words, the reflecting layer is capable of internally reflecting the blue exciting light without internally reflecting the emitted light from the photoluminescent layer. At the same time, the blue light-reflecting layer on the surface of the dye layer 34 and 38 opposite the viewing side electrodes should not reflect the longer wavelength light that generates the other colours. The reflecting layer on the other surface of the dye layers, preferably, reflects all wavelengths of light. In addition, the reflecting layers may comprise optical interference filters.

In another embodiment as shown in FIG. 5, the photoluminescent phosphor layer (i e. the photoluminescent red-emitting dye layer 34 and the photoluminescent green-emitting dye layer 38) has at least one optical filter 58 on the surface of the photoluminescent phosphor layer opposite the viewing side electrodes. The optical filter inhibits the photoluminescent phosphor layer from substantially absorbing ambient light (i e. light from an external light source), in particular, blue ambient light. At the same time, the filter on the surface of the photoluminescent layer should not absorb the light emitted by the photoluminescent phosphor layer.

In general, with respect to the embodiments described above, a variety of substrates may be used, as would be understood by persons skilled in the art. Preferably, the substrate is a rigid refractory sheet. Examples of suitable rigid refractory sheet materials include, but are not limited to, ceramics such as alumina, metal ceramic composites, glass ceramic materials and high temperature glass materials.

The row electrode may be any suitable electrically conductive film known to those skilled in the art. Preferably, the row electrode comprises gold or a silver alloy.

The thick dielectric layer is designed to provide high resistance against dielectric breakdown when the display is operated at the voltage required to produce the display luminance. Typically, the thick dielectric film layer comprises a sintered perovskite, piezoelectric or ferroelectric material such as lead magnesium niobate-titanate (PMN-PT) with a dielectric constant of several thousand and a thickness greater than about 10 micrometers to prevent dielectric breakdown. The thick dielectric luminescent display described herein may also comprise a high dielectric constant smoothing layer exemplified by lead zirconate titanate and applied using sol gel or metal organic deposition methods and one or more thin film dielectric layers deposited thereon.

Further examples of suitable substrates, row electrodes and thick dielectric layers for use in the present invention are described in Applicant's U.S. Pat. No. 5,432,015 and co-pending U.S. Patent Application No. 60/341,790 filed Dec. 21, 2001 (the disclosures of which are incorporated herein by reference in their entirety).

The thin dielectric layers used herein may include barium titanate, alumina, silicon oxynitride, barium tantalate, tantalum oxide and the like.

The electroluminescent phosphor layer used herein comprises any blue emitting electroluminescent phosphor material. Preferably, a material that emits blue light with acceptable CIE coordinates, such as x less than about 0.2 and y less than about 0.15, and a suitably high luminosity is used. The blue emitting electroluminescent phosphor material may comprise a blue emitting rare earth activated alkaline earth sulfide. The blue emitting rare earth activated alkaline earth sulfide may be selected from the group consisting of rare earth activated alkaline earth thioaluminates, rare earth activated alkaline earth thiooxyaluminates, rare earth activated alkaline earth thiogallates, rare earth activated alkaline earth thiooxygallates, rare earth activated alkaline earth thioindates, rare earth activated alkaline earth thiooxyindates and mixtures thereof. Preferably, the blue emitting electroluminescent phosphor material is europium activated barium thioaluminate ($BaAl_2S_4$:Eu).

The electroluminescent phosphor layer is preferably continuous rather than patterned. The blue light emitted by the electroluminescent phosphor layer may not be completely emitted and/or converted by the display or device. Some light may emit into the portion of the display below the electroluminescent phosphor layer. A continuous electroluminescent phosphor layer may prevent the escape of the emitted light into the portion of the display below the electroluminescent phosphor layer by allowing the light to propagate along the layer such that it is emitted or converted by the display.

The CIE coordinates of the blue emitting electroluminescent phosphor material may be optimized by using an optical filter thereover.

The viewing side electrode is a transparent electrically conductive layer, typically, an oxide such as indium tin oxide (ITO) or doped zinc oxide.

The photoluminescent phosphor layer used herein comprises any phosphor material that can emit the desired color having the desired CIE coordinates and luminance upon excitation by blue light. The photoluminescent phosphor layer may comprise at least one dye, at least one photoluminescent powder, or mixtures thereof.

The dyes are, preferably, organic dyes such as a red light emitting dye, a yellow light emitting dye, and a green light emitting dye. An example of a suitable red light emitting dye is ADS™—100RE (American Dye Source Inc., Canada). An example of a suitable green light emitting dye is ADS™—085GE (American Dye Source Inc., Canada). In addition, dyes may be chosen from dyes used for tunable dye lasers that can be adequately excited with blue light. Useful light emitting dyes may include, but are not limited to, Lumogen™ F Red 300 (red emitter), Lumogen™ Red 300 Nanocoloran™ (red emitter), and Lumogen™ F Yellow 083 (yellow emitter) (BASF Aktiengesellschaft of Germany) and ADS™ 100RE (red emitter) (American Dye Source Inc., Canada). Useful green light emitting dyes may include, but are not limited to, ADS™ 085GE (American Dye Source Inc., Canada).

Some suitable photoluminescent powders are inorganic photoluminescent powders, which may be either crystalline or amorphous powders. Specific examples of inorganic photoluminescent powders include rare earth activated alkaline earth thioaluminates, rare earth activated alkaline earth thiogallates and rare earth activated alkaline earth thioindates, rare earth activated alkaline earth sulfides, yttrium aluminum garnet and rare earth activated alkaline earth silicates, rare earth activated alkaline earth germanates, rare earth activated alkaline earth aluminates, and rare earth activated alkaline earth borates.

The inorganic photoluminescent powders include inorganic semi-conductor materials, in particular, inorganic semiconductor nanocrystalline material such as those described in U.S. Pat. No. 6,608,439 (herein incorporated by reference). Suitable inorganic semiconductor nanocrystals may be in the size range of about 10 to about 200 Angstroms, which covers optical conversion through the visible spectrum. The semiconductor nanocrystals may be selected from the group of semiconductor compounds CdS, CdSe, CdTe and mixtures thereof. The synthesis and properties of nanocrystals from the cadmium family is described in an article by C. B. Murray, D. J. Norris and M. G. Bawendi, "Synthesis and characterization of nearly monodisperse CdE (E=S, Se, Te) semiconductor nanocrystallites," J. Am. Chem. Soc. 115 (1993) 8706-8715 (incorporated herein by reference). Methods of fabricating semiconductor nanocrystals are disclosed in U.S. Pat. No. 5,559,057 and U.S. Pat. No. 5,525,377 (also incorporated herein by reference). The loading of the nanocrystals in the photoluminescent phosphor layer is sufficient such that the layer substantially absorbs the blue light emitted by the electroluminescent phosphor layer.

The photoluminescent phosphor layer may be an insulating material with a band gap having an energy less than that of a photon of the blue light emitted (ie. the band gap has an energy equal to that of a photon with a longer wavelength than that of the blue emitted light). The insulating material may also include a dye.

Typically, when the photoluminescent phosphor layer is a dye or a photoluminescent powder, the photoluminescent phosphor layer is much thicker than the electroluminescent phosphor layer. The dye is not typically in the form of a vacuum deposited thin film as the electroluminescent phosphor layer. The dyes or the photoluminescent powders are dispersed in a matrix material such as polymethylmethacrylate (PMMA), epoxy or polymethylglutaridimide.

The photoluminescent phosphor layers are typically thick enough to absorb all of the emitted blue light but thin enough to allow the emission of the converted blue light. The thickness depends on the optical absorption length of the photoluminescent phosphor at the blue light frequency and at the emitted light frequency. The preferable thickness of the photoluminescent phosphor layer is about 1 to about 10 microns.

The conversion efficiency for blue light excitation of organic dyes is very high, typically about 80%. In another embodiment, a full colour display, with a ratio of blue to green to red is 1:3.8:1.8 suitable for television application, can be constructed with 80% conversion of blue light from a thick dielectric electroluminescent display having a europium activated barium 150 cd/m$^2$ thioaluminate phosphor layer.

In a further embodiment of the invention, is a novel photoluminescent phosphor material and method of making such material. The photoluminescent phosphor material may be used for any type of display where it is desirable to convert blue light to longer wavelength light. As such, the photoluminescent phosphor material may be incorporated into any emissive display that can utilize colour conversion materials, such as, but are not limited to, OLEDs, liquid crystal displays, plasma displays and thick film dielectric electroluminescent displays.

The photoluminescent phosphor material comprises a pigment powder that comprises a solid solution of organic photoluminescent molecules. The pigment powder is dispersed in a matrix material. The matrix material is chemically and physically compatible with the pigment powder such that the photoluminescent efficiency of the organic photoluminescent molecules is substantially maintained. This particular type of photoluminescent phosphor material may be used in various types of emissive displays. This phosphor material overcomes the difficulties of dissolving organic photoluminescent molecules in a single material. For instance, the organic photoluminescent molecules of the pigment powder tend to cluster, especially as the organic photoluminescent molecule concentration is increased, thereby substantially degrading the photoluminescent efficiency of the organic photoluminescent molecules. The photoluminescent phosphor material of the present invention minimizes such clustering via dispersing the pigment powder in the matrix, which therefore facilitates an increase in the average organic photoluminescent molecule concentration in the photoluminescent phosphor, thereby increasing the photoluminescent efficiency, and facilitating the fabrication of emissive displays with higher luminance.

In order to make the photoluminescent phosphor material, one method comprises mixing the pigment powder and the matrix material to provide a uniform dispersion of the pigment powder in the matrix material. The uniform dispersion may be printed or spread on a substrate such as an optically transparent substrate to form a photoluminescent phosphor layer.

Some examples of pigment powders include, but are not limited to, a green pigment Radiant™ MC-CH5860, a green pigment Radiant™ MP-CH5510, a blue pigment Radiant™ MP-BL5529, a red pigment Radiant™ MC-RD5515, a red pigment Radiant™ MC-OR5864, and a yellow pigment Radian™ MC-OY5862, and mixtures thereof. All pigment powders were obtained from Magruder Color Company.

The matrix material may be any material that is chemically and physically compatible with the pigment powder such that the photoluminescent efficiency of the organic photoluminescent molecules is substantially maintained. The matrix material may be an epoxy such as UV-imagable resin Luxul™1010 (80-B). Others may include those mentioned above, for instance, polymethylmethacrylate (PMMA) or polymethylglutaridimide. It is desirable to use a matrix material that can be patterned using photolithographic methods (e.g. the matrix material is a photoresist material that can be exposed to light through a patterned mask so that the unwanted part of the matrix material dissolves away to form the desired pixel pattern).

The loading of the pigment powder in the matrix material is sufficient such that the photoluminescent phosphor material substantially absorbs the blue light emitted. For instance, the pigment powder in the matrix material is sufficient such that the photoluminescent phosphor material substantially absorbs the blue light emitted by the electroluminescent phosphor layer.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1

A blue-emitting electroluminescent pixel having a europium activated barium thioaluminate phosphor film was fabricated on a 5 centimeter (length)×5 centimeter (width)×1 millimeter (thick) alumina substrate fabricated using the methods as described in Applicant's co-pending International Patent Application PCT/CA03/00568 filed Apr. 17, 2003 (the disclosure of which is incorporated herein in its entirety). The pixel was operated with repetitive alternating polarity 32 microsecond wide square-wave pulses and a frequency of 120 Hz giving 240 light pulses per second. The pulse amplitude was varied. in increments of 10 volts up to 260 volts. The luminance as a function of voltage indicates a luminance at 60 volts above the threshold voltage of 100 to 150 candelas per square meter.

Example 2

A solution of a green-emitting photoluminescent dye, ADS-085GE™ (American Dye Source Inc., Canada) was poured into a flat bottomed glass container that was placed over the pixel of Example 1. The dye solution was observed to brightly luminesce green.

EXAMPLE 3

A solution of a red-emitting photoluminescent dye, ADS-100RE™(American Dye Source Inc., Canada) was deposited on a glass substrate and allowed to dry. It was placed with the dye layer facing the pixel of Example 1 and tested using the procedure described in Example 1. The dye was observed to brightly luminesce with a red color with no penetration of the blue exciting light through the dye.

Example 4

A blue-emitting electroluminescent pixel similar to that of Example 1 was screen printed with a 20 to 30 micrometer thick layer of europium activated strontium thiogallate powder ($SrGa_2S_4$:Eu) (obtained from Phosphor Technology Ltd of Nazeing, Essex, U.K.) dispersed in Epo-Tek 302™, a thermally curable epoxy (Epoxy Technology Inc. MA, U.S.A.). The powder was mixed in an approximate 1:1 ratio by weight with the epoxy. A second pixel on the same substrate was left uncoated.

The uncoated pixel had a luminance of 110 candelas per square meter and CIE colour coordinates of x=0.135 and y=0.116 when it was operated under the driving conditions specified in Example 1. The coated pixel had a luminance of about 200 candelas per square meter and CIE colour coordinates of x=0.26 and y=0.61 corresponding to green light.

Example 5

Blue-emitting electroluminescent pixels on a common substrate similar to those of Example 1 were fabricated. One of the pixels was screen printed with a 20 to 30 micrometer thick layer of cerium activated yttrium aluminum garnet (YAG) powder (product number GP-47 obtained from Leuchtstoffwerk GmbH of Heidelberg, Germany) dispersed at an approximate weight ratio of 1:1 in Epo-Tek 302™ epoxy.

The uncoated pixel had a blue luminance of 240 candelas per square meter with CIE colour coordinates of x=0.134 and y=0.12 under the same operating conditions of Example 1. By contrast, the coated pixel had a yellow luminance of 600 candelas per square meter with CIE coordinates of x=0.41 and y=0.51.

Example 6

Blue-emitting electroluminescent pixels on a common substrate similar to those of Example 1 were fabricated. One of the pixels was screen printed with a 20 to 30 micrometer thick layer of europium activated strontium sulfide (Phosphor Technology Ltd of Nazeing, Essex, U.K.) dispersed at an approximate weight ratio of 1:1 in Epotek 302™ epoxy.

The uncoated pixel had a blue luminance of 131 candelas per square meter and CIE color coordinates of x=0.135 and y=0.11 and the coated pixel had a luminance of 84 candelas per square meter with CIE color coordinates of x=0.61 and y=0.36. Applying a thicker coat, which is double the thickness of the first coat, did not result in any change in the color coordinates but the luminance decreased to half that of the pixel with the thinner coating indicating that the blue emission was completely absorbed even with the thinner coating.

Example 7

Two pixels on a common substrate, one uncoated and the other coated with a 20 to 30 micrometer thick layer of europium activated calcium sulfide (Phosphor Technology Ltd) dispersed in Epo-Tek 302™ were fabricated and tested. For this coating, the blue light was not completely absorbed, as indicated by a blue emission peak at 470 nanometers wavelength. The uncoated pixel had a luminance of 121 $cd/m^2$ and CIE color coordinates of x=0.135 and y=0.14 when it was operated under the same conditions as in Example 1. The coated pixel had a luminance level of 61 $cd/m^2$ and CIE color coordinates of x=0.53 and y=0.31. The low x=color coordinate is due to the fact that the blue emission was not completely absorbed and as a result a mixture of blue and red emissions emanated from the pixel.

Example 8

Two pixels on a common substrate, one uncoated and the other coated similar to that of example 7, but with a thicker 50 micrometer coating of europium activated calcium sulfide-containing film were fabricated and tested. The coated pixel did not transmit the blue light, but the red light emission was lower. For the uncoated pixel, the blue luminance was about 188 cd/m$^2$ with CIE color coordinates of x=0.135 and y=0.12 when operated under the same conditions as the pixel of Example 1. The coated pixel had a luminance level of 66 cd/m$^2$ and CIE color coordinates of x=0.66 and y=0.31.

Example 9

Two pixels on a common substrate, one uncoated and the other coated with a 5 to 7 micrometer thick coating of a red-emitting luminescent film prepared by spin coating onto the pixel a solution prepared by dissolving about 0.5 grams of Lumogen™ red R300 (BASF Aktiengessellschaft Germany) into 100 grams of a PMMA solution (Nano-950 PMMA A-9™, MicroChem Inc., MA, U.S.A.). The desired thickness was obtained through successive spin coating and drying steps.

The blue luminance of the uncoated pixel was 160 candelas per square meter with CIE color coordinates of x=0.135 and y=0.112. The red emission from the coated pixel was 110 candelas per square meter with CIE coordinates of x=0.27 and y=0.15. The colour coordinates for the coated pixel do no correspond to red because a substantial portion of the blue emission was transmitted through the red-emitting luminescent film.

Example 10

Two pixels on a common substrate, one uncoated and the other coated with a 15 micrometer thick coating of a yellow-emitting luminescent film prepared by spin coating onto the pixel a solution prepared by dissolving about 0.4 grams of Lumogen™ Yellow 083 (BASF) into 100 grams of PMMA solution (Nano-950 PMMA A-9™, MicroChem Inc., MA, U.S.A.).

The blue luminance of the uncoated pixel was 147 candelas per square meter with CIE coordinates of x=0.135 and y=0.13 and the luminance of the coated pixel was 450 candelas per square meter with CIE coordinates of x 0.42 and y=0.56 to provide a yellow emission.

Example 11

This example demonstrates that multiple conversion layers improve the overall light conversion from blue to red over that with a single red-emitting layer. Two pixels were prepared as in Example 10, except that the yellow emitting layer was covered by a 5 micrometer thick red emitting layer using the method described in Example 9.

The blue luminance of the uncoated pixel was 147 candelas per square meter with CIE coordinates of x=0.135 and y=0.13 and the red luminance of the pixel with the double coat was 83 candelas per square meter with CIE coordinates of x=0.63 and y=0.32, providing a saturated red colour. Thus the combination of the yellow-emitting and the red-emitting layers completely absorbed the blue and the yellow light from the lower conversion layer to give emission solely from the red-emitting layer.

Example 12

This example demonstrates that light conversion efficiency of a device similar to that of example 11 can be improved by optimization of the layer thickness and the Lumogen™ concentration in the layers. Two pixels were prepared as in example 11, except that the concentration of yellow Lumogen™ in PMMA was reduced by about a factor of two and the yellow Lumogen™ layer thickness was increased to 20 micrometers. The layer deposition process was also different in that the two Lumogen™-containing layers were successively deposited and then cured together by heating to 160° C. for 45 minutes rather than curing the layers separately.

The blue luminance of the uncoated pixel was 89 candelas per square meter and the luminance of the coated pixel was 70 candelas per square meter with CIE coordinates of x=0.66 and y=0.31. The ratio of red luminance to blue luminance for this example is thus 0.89:1 as compared to 0.56:1 for Example 11. Although some of the improved ratio can be attributed to a greater weighting of the emission at somewhat shorter wavelength to increase the ratio of luminance to irradiance in this example, the major part of the improvement is due to an increase in the efficiency with which the blue light was converted to red light.

Example 13

This example demonstrates an improvement in light conversion efficiency is achievable by homogeneous co-doping of yellow and red Lumogen™ dyes in a single layer to simplify the pixel design and reduce the overall thickness of the conversion layer. For this example, two substrates, each with an uncoated pixel and a coated pixel on the same substrate, were coated with a single five micrometer thick layer deposited by spin coating onto the pixel a solution made by dissolving between 0.25 and 0.8 grams of the red Lumogen™ and 0.5 to 1.8 grams of the yellow Lumogen™ into 100 grams of PMMA.

For the first coated pixel the weight of yellow Lumogen™ dye dissolved in the 100 grams PMMA was 1.0 gram and the weight of red Lumogen™ dye was 0.50 grams to give a weight ratio of yellow to red Lumogen™ dyes of about 2:1 The uncoated pixel had a luminance of 294 candelas per square meter and the coated pixel had a luminance of 173 candelas per square meter with CIE coordinates of x=0.63 and y=0.32, providing a ratio of red to blue luminance of 0.59.

For the second coated pixel the weight of dissolved yellow Lumogen™ dye was 1.10 grams and the weight of dissolved red Lumogen™ dye was 0.40 grams to give a higher ratio of yellow to red Lumogen™ dyes of about 2.7:1.

The uncoated pixel had a luminance of 253 candelas per square meter and the coated pixel had a luminance of 161 candelas per square meter with CIE coordinates of x=0.68 and y=0.32, providing a ratio of red to blue of 0.64:1.

Example 14

This example demonstrates that the conversion efficiency is dependent on the matrix material in which the Lumogen™ are dissolved. Two pixels on a common substrate were constructed as in Example 12. For this example, the thickness of the layer having the yellow Lumogen™ dye in the PMMA matrix was 15 micrometers. To form the red Lumogen™ dye-containing layer, about 0.1 grams of the red Lumogen™ was dissolved in 10 milliliters of Nano PMGI-SF-19 polymethylglutaridimide obtained from MicroChem of Newton, Mass., U.S.A. instead of PMMA and a 10 micrometer layer containing the red Lumogen™ dye was formed on top of the yellow layer from this solution.

The uncoated pixel had a luminance of 230 candelas per square meter and the coated pixel had a luminance of 193 candelas per square meter with CIE coordinates of x=0.63 and y=0.33, giving a ratio of red to blue luminance of 0.84:1.

Example 15

This example demonstrates that an improvement in light conversion efficiency is achievable by using red dye particles, Lumogen™ Red Nanocoloran™ (BASF Aktiengessellschaft Germany) particles in place of the Lumogen™ Red 300 dye. The nanocolorant dye makes it possible to achieve higher loading density of the red dye without losing conversion efficiency due to agglomeration of the dye particles. In order to enhance the conversion efficiency, a small amount of Lumogen™ Yellow dye was added to the coating layer.

Two substrates, one with an uncoated pixel and the other with a coated pixel on the same substrate were constructed. The coating was a single layer 5-8 micrometers thick deposited by spin coating onto the pixel from a solution made by dissolving between 0.80-1.60 grams of the Lumogen™ Red Nanocolorant™ and 0.15 to 0.50 grams of Lumogen™ Yellow F 083 into 20 grams of PMMA solution. The PMMA solution was prepared by dissolving 15 grams of PMMA with an average molecular weight of 996k obtained from, Sigma-Aldrich Canada Ltd. Oakville Ontario Canada into 100 grams of anisole.

The uncoated pixel had a luminance of 133 candelas per square meter and the coated pixel had a luminance of 160 candelas per square meter with CIE coordinates of x=0.645 and y=0.350, providing a ratio of red to blue luminance of 1.20.

Example 16

This example demonstrates that blue light can be converted to green light with high efficiency using organic dyes. Two pixels on a common substrate were constructed as in Example 1, but where one pixel had a coating prepared by spin coating a solution of Pyranine dye dissolved in epoxy. The solution was prepared by dissolving between 0.01 and 0.04 grams of Keystone Pyranine10G™ 120% dye (Keystone Aniline Corporation of Chicago, Ill., U.S.A.) into about 0.7 grams of part B of Epotek 302™ epoxy and then adding an equal amount of part A of the epoxy. After this solution was mixed by stirring for a few minutes, several drops of ethylene glycol was added, while stirring continued, to initiate thickening of the solution. When the viscosity of the solution increased to a paste consistency, it was screen printed onto the pixel to form a 20 to 30 micrometer thick film. It was cured at room temperature for several hours.

The uncoated blue pixel had a luminosity of 300 candelas per square meter with CIE coordinates of x=0.134 and y=0.12 and the coated pixel had green luminance of 1000 candelas per square meter with CIE coordinates of x=0.24 and y=0.65 thus providing a ratio of green to blue luminance of 3.3:1.

Example 17

This example shows the utility of a photoluminescent layer containing a green pigment that has a high photoluminescent efficiency A screen printable paste was prepared by dispersing 60 grams of green pigment Radiant™ MC-CH5860 obtained from Magruder Color Company (2800 Radiant Ave, Richmond Calif., USA) in 100 grams of one-part UV-imagable resin Luxul-1010 (80-B) that was formulated and provided by Pesiff Corp (Toronto ON, Canada). The paste was mixed thoroughly to obtain a uniformly dispersion of the pigment into the resin.

Two blue-emitting pixels on a common substrate similar to that of Example 1 were prepared. One was screen printed with a 10 to 20 micrometer thick layer of the prepared paste described above. The second pixel was left uncoated.

The ratio of the luminance of the coated pixel to that of the uncoated blue-emitting pixel that was obtained was 4:1. The uncoated pixel had a luminance of 104 candelas per square meter and CIE colour coordinates of x=0.135 and y=0.102 when it was operated under the driving conditions specified in Example 1. The coated pixel had a bright green emission with luminance of about 426 candelas per square meter and CIE colour coordinates of x=0.27 and y=0.65.

Example 18

This example shows the utility of a different pigment that also provides green emission.

Two blue-emitting pixels on a common substrate were prepared similar to that of example 1.

A screen printable paste was prepared by dispersing 50 grams of green pigment Radiant™ MP-CH5510 obtained from Magruder Color Company (2800 Radiant Ave, Richmond Calif., USA) in 100 grams of one-part UV-imagable resin Luxul-1010 (80-B). The paste was mixed thoroughly to obtain a uniform dispersion of the pigment into the resin. One of the pixels was screen printed with a 10 to 20 micrometer thick layer of the prepared paste. The second pixel was left uncoated.

The ratio of the luminance of the coated pixel to that of the uncoated blue-emitting pixel that was obtained was 3.4:1. The uncoated pixel had a luminance of 78 candelas per square meter and CIE colour coordinates of x=0.135 and y=0.115 when it was operated under the driving conditions specified in Example 1. The coated pixel had a bright green emission with luminance of about 267 candelas per square meter and CIE colour coordinates of x=0.265 and y=0.65.

Example 19

This example shows the utility of adding an additional pigment powder to the photoluminescent layer to obtain a more saturated green emission, albeit with a lower luminance. This shows that the balance between luminance and colour saturation can be optimized by an appropriate selection of one or more pigments for inclusion in the photoluminescent layer. 1 gram of a blue pigment Radian™ MP-BL5529 (Magruder Color Company) was added to 25 grams from the paste described in example 16. Blue-emitting pixels on a common substrate similar to those of Example 1 were fabricated. One of the pixels was screen printed with a 10 to 20 micrometer thick layer of the prepared paste.

The uncoated pixel had a blue luminance of 138 candelas per square meter with CIE colour coordinates of x=0.135 and y=0.112 under the operating conditions of Example 1. The coated pixel had a deep green luminance of 322 candelas per square meter with CIE coordinates of x=0.23 and y=0.67.

Example 20

This example shows the utility of a red-emitting pigment powder for a photoluminescent layer A screen printable paste was prepared by dispersing 80 grams of red pigment Radiant™ MC-OR5864 obtained from Magruder Color Company (2800 Radiant Ave, Richmond Calif., USA) into 100 grams of one-part UV-imagable resin Luxul-1010 (80-B). The paste was mixed thoroughly to obtain a uniform dispersion of the pigment into the resin.

Two blue-emitting pixels on a common substrate similar to that of Example 1 were prepared. One of the pixels was screen printed with a 10 to 20 micrometer thick layer of the prepared paste. A second pixel on the same substrate was left uncoated.

The ratio of the luminance of the coated pixel to that of the uncoated blue-emitting pixel that was obtained was 1.5:1. The uncoated pixel had a luminance of 100 candelas per square meter and CIE colour coordinates of $x=0.134$ and $y=0.110$ when it was operated under the driving conditions specified in Example 1. The coated pixel had a bright red emission with luminance of about 148 candelas per square meter and CIE colour coordinates of $x=0.622$ and $y=0.337$.

Example 21

This example shows the utility of adding a yellow pigment powder to the photoluminescent layer of example 19 to obtain a higher ratio of red to blue emission.

A screen printable paste was prepared by dispersing 68 grams of red pigment Radiant™ MC-OR5864 and 2.75 grams of yellow pigment Radiant™ MC-OY5862, both obtained from Magruder Color Company (2800 Radiant Ave, Richmond Calif., USA) into 100 grams of one-part UV-imagable resin Luxul-1010 (80-B). The paste was mixed thoroughly to obtain a uniform dispersion of the pigment into the resin.

Two blue emitting pixels on a common substrate similar to that of Example 1 were prepared. One pixel was screen printed with a 10 to 20 micrometer thick layer of the prepared paste. A second pixel on the same substrate was left uncoated.

The ratio of the luminance of the coated pixel to that of the uncoated blue-emitting pixel that was obtained was 1.7:1. The uncoated pixel had a luminance of 150 candelas per square meter and CIE colour coordinates of $x=0.134$ and $y=0.106$ when it was operated under the driving conditions specified in Example 1. The coated pixel had a bright red emission with luminance of about 256 candelas per square meter and CIE colour coordinates of $x=0.63$ and $y=0.34$.

Example 22

This example shows how the CIE colour coordinates of the red emission can be obtained by a judicious choice of red and yellow pigments.

A screen printable paste was prepared by dispersing 50 grams of red pigment Radiant™ MC-RD5515 and 43 grams of yellow pigment Radiant™ MC-OY5862, both obtained from Magruder Color Company (2800 Radiant Ave, Richmond Calif., USA) into 100 grams of one-part UV-curable resin Luxul-1010 (80-B). The paste was mixed thoroughly to obtain a uniform dispersion of the pigment in the resin.

Two blue-emitting pixels on a common substrate similar to that of Example 1 were prepared. One pixel was screen printed with a 10 to 20 micrometer thick layer of the prepared paste. A second pixel on the same substrate was left uncoated.

The ratio of the luminance of the coated pixel to that of the uncoated pixel was 1.6:1. The uncoated pixel had a luminance of 64 candelas per square meter and CIE colour coordinates of $x=0.134$ and $y=0.114$ when it was operated under the driving conditions specified in Example 1. The coated pixel had a bright red emission with a luminance of about 102 candelas per square meter and CIE colour coordinates of $x=0.61$ and $y=0.35$.

The invention claimed is:

1. A pixel sub-structure for a thick film dielectric electroluminescent display comprising a thick film dielectric layer located between a first electrode and a second electrode; and said pixel sub-structure comprising:
    at least two sub-pixels, each sub-pixel comprising a blue light emitting electroluminescent inorganic phosphor layer; and
    at least one photoluminescent phosphor layer, each photoluminescent phosphor layer being associated with a respective one of said sub-pixels such that the blue light emitted by each respective one of said sub-pixels is substantially absorbed by the associated photoluminescent phosphor layer thereby causing said photoluminescent phosphor layer to emit a colored light other than the blue light.

2. A pixel sub-structure according to claim 1, wherein said sub-structure comprises two sub-pixels and one photoluminescent phosphor layer.

3. A pixel sub-structure according to claim 1, wherein said sub-structure comprises three sub-pixels and a first and a second photoluminescent phosphor layer, said first photoluminescent phosphor layer emits a colored light other than the blue light and said second photoluminescent phosphor layer emits a colored light other than the blue light and said colored light of said first photoluminescent phosphor layer.

4. A pixel sub-structure according to claim 1, wherein each sub-pixel further comprises a viewing side electrode associated with said blue emitting electroluminescent inorganic phosphor layer; and each photoluminescent phosphor layer is associated with said viewing side electrode of said respective one of said sub-pixels.

5. A pixel sub-structure according to claim 4, wherein a reflecting layer is disposed over one or both surfaces of said photoluminescent phosphor layer.

6. A pixel sub-structure according to claim 4, wherein each photoluminescent phosphor layer is disposed on said viewing side electrode of said respective one of said sub-pixels.

7. A pixel sub-structure according claim 6, wherein each photoluminescent phosphor layer is disposed on an optically transparent barrier layer, said optically transparent barrier layer being disposed on said second electrode configured as a viewing side electrode.

8. A pixel sub-structure according to claim 4, further comprising a thin optically transparent sheet disposed over said viewing side electrodes, said at least one photoluminescent phosphor layer being adhered to one side of said optically transparent sheet opposite to said viewing side electrodes, a transparent cover plate being disposed over the optically transparent sheet such that an air gap is formed between the optically transparent sheet and the transparent cover plate, with said at least one photoluminescent phosphor layer therebetween.

9. A pixel sub-structure according to claim 4, comprising at least two photoluminescent phosphor layers.

10. A pixel sub-structure according to claim 1, comprising a plurality of photoluminescent phosphor layers, each photoluminescent phosphor layer being associated with a different one of said sub-pixels.

11. A pixel sub-structure according to claim 1, further comprising at least one reflecting layer associated with said at least one photoluminescent phosphor layer.

12. A pixel sub-structure according to claim 1, further comprising at least one optical filter associated with said at least one photoluminescent phosphor layer such that said filter inhibits said at least one photoluminescent phosphor layer from substantially absorbing blue ambient light.

13. A pixel sub-structure according to claim 1, wherein an optical filter is disposed over the surface of said photoluminescent phosphor layer opposite to said second electrode, configured as a viewing side electrode, such that said filter inhibits said at least one photoluminescent phosphor layer from substantially absorbing blue ambient light.

14. A pixel sub-structure according to claim 1, comprising three sub-pixels.

15. A pixel sub-structure according to claim 1, wherein said blue light emitting electroluminescent inorganic phosphor is a blue emitting rare earth activated alkaline earth sulfide.

16. A pixel sub-structure according to claim 15, wherein said blue emitting rare earth activated alkaline earth sulfide is selected from the group consisting of rare earth activated alkaline earth thioaluminates, rare earth activated alkaline earth thiooxyaluminates, rare earth activated alkaline earth thiogallates, rare earth activated alkaline earth thiooxygallates, rare earth activated alkaline earth thioindates, rare earth activated alkaline earth thiooxyindates and mixtures thereof.

17. A pixel sub-structure according to claim 16, wherein said blue emitting rare earth activated alkaline earth sulfide is europium activated barium thioaluminate.

18. A pixel sub-structure according to claim 1, wherein said blue light emitting electroluminescent inorganic phosphor emits blue light having acceptable CIE coordinates with x less than about 0.2 and y less than about 0.15.

19. A pixel sub-structure according to claim 1, wherein said at least one photoluminescent phosphor layer is an insulating material with a band gap having an energy less than that of a photon of the blue light emitted.

20. A pixel sub-structure according to claim 1, wherein said photoluminescent phosphor layer comprises at least one dye, at least one dye in a matrix component, at least one photoluminescent powder, at least one photoluminescent powder in a matrix component, or mixtures thereof.

21. A pixel sub-structure according to claim 20, wherein said at least one dye is selected from the group consisting of red light emitting dyes, green light emitting dyes, and yellow light emitting dyes.

22. A pixel sub-structure according to claim 20, wherein said at least one photoluminescent powder is at least one inorganic photoluminescent powder.

23. A pixel sub-structure according to claim 22, wherein said at least one inorganic photoluminescent powder is selected from the group consisting of rare earth activated alkaline earth thioaluminates, rare earth activated alkaline earth thiogallates, rare earth activated alkaline earth thioindates, rare earth activated alkaline earth sulfides, yttrium aluminum garnet and rare earth activated alkaline earth silicates, rare earth activated alkaline earth germanates, rare earth activated alkaline earth aluminates, and rare earth activated alkaline earth borates.

24. A pixel sub-structure according to claim 22, wherein said at least one inorganic photoluminescent powder is an inorganic semiconductor material.

25. A pixel sub-structure according to claim 24, wherein said inorganic semiconductor material is an inorganic semiconductor nanocrystalline material.

26. A pixel sub-structure according to claim 25, wherein said inorganic semiconductor nanocrystalline material is selected from the group consisting of semiconductor compounds CdS, CdSe, CdTe and mixtures thereof.

27. A pixel sub-structure according to claim 25, wherein said inorganic semiconductor nanocrystalline material comprises crystals in a size range of about 10 to about 200 Angstroms.

28. A pixel sub-structure according to claim 20, wherein said matrix component is selected from the group consisting of PMMA, epoxy and polymethylglutaridimide.

29. A pixel sub-structure according to claim 1, wherein at least one thin dielectric layer is on at least one surface of said blue light emitting electroluminescent inorganic phosphor layer.

30. A pixel sub-structure according to claim 1, further comprising a transparent cover plate, wherein said at least one photoluminescent phosphor layer is adhered thereto.

31. A pixel sub-structure according to claim 30, wherein said at least one photoluminescent phosphor layer is adhered to the outer surface of said transparent cover plate and said at least one photoluminescent phosphor layer is coated with an optically transparent passivating layer.

32. A pixel sub-structure according to claim 1, wherein said photoluminescent phosphor layer is about 1 to about 10 microns in thickness.

33. A method of making a pixel sub-structure of claim 1 for a thick film dielectric electroluminescent display, said method comprising:
disposing each photoluminescent phosphor layer over a respective one of said sub-pixels such that the blue light emitted by each respective one of said sub-pixels is substantially absorbed by said associated photoluminescent phosphor layer thereby causing said photoluminescent phosphor layer to emit a colored light other than the blue light.

34. A method according to claim 33, wherein said pixel sub-structure comprises three sub-pixels and a first and a second photoluminescent phosphor layer, said disposing step comprising:
disposing said first photoluminescent phosphor layer over one of said sub-pixels such that the blue light emitted by that sub-pixel is substantially absorbed by said first photoluminescent phosphor layer thereby causing said first photoluminescent phosphor layer to emit a colored light other than the blue light; and
disposing said second photoluminescent phosphor layer over another one of said sub-pixels such that the blue light emitted by that sub-pixel is substantially absorbed by said second photoluminescent phosphor layer thereby causing said second photoluminescent phosphor layer to emit a colored light other than the blue light and said colored light of said first photoluminescent phosphor layer.

35. A method according to claim 33 further comprising:
disposing the second electrode as at least two viewing side electrodes over said blue emitting electroluminescent inorganic phosphor layer; and
disposing each photoluminescent phosphor layer over a respective one of said viewing side electrodes such that the blue light emitted by said electroluminescent phosphor layer is substantially absorbed by said associated photoluminescent phosphor layer thereby causing said photoluminescent phosphor layer to emit a colored light other than the blue light.

36. A method according to claim 35, wherein said pixel sub-structure comprises three sub-pixels, three viewing side electrodes, and a first and a second photoluminescent phosphor layer, said disposing step comprising:
disposing a first photoluminescent phosphor layer over one of said viewing side electrodes such that the blue light emitted by said electroluminescent phosphor layer is substantially absorbed by said first photoluminescent phosphor layer thereby causing said first photoluminescent phosphor layer to emit a colored light other than the blue light; and disposing a second photoluminescent phosphor layer over an other one of said viewing side electrodes such that the blue light emitted by said electroluminescent phosphor layer is substantially absorbed by said second photoluminescent phosphor layer thereby causing said second photoluminescent phosphor layer to emit a colored light other than the blue light and said colored light of said first photoluminescent phosphor layer.

37. A method of making the pixel sub-structure according to claim 35, further comprising disposing a transparent cover plate over said viewing side electrodes and adhering said photoluminescent phosphor layer thereto.

38. A method of making the pixel sub-structure according to claim 35, further comprising coating said photoluminescent phosphor with an optically transparent passivating layer.

39. A method of making the pixel sub-structure according to claim 33, further comprising disposing a transparent cover plate over said sub-pixels and adhering said photoluminescent phosphor layer thereto.

40. A method of making the pixel sub-structure according to claim 33, further comprising coating said photoluminescent phosphor with an optically transparent passivating layer.

41. A method of making the pixel sub-structure according to claim 33, further comprising disposing at least one reflecting layer on at least one surface of said photoluminescent phosphor layer.

42. A method of making the pixel sub-structure according to claim 33, further comprising disposing at least one optical filter over said photoluminescent phosphor layer such that said filter inhibits said photoluminescent phosphor layer from substantially absorbing blue ambient light.

43. A pixel sub-structure according to claim 1, further comprising a thin optically transparent sheet disposed over said sub-pixels, said at least one photoluminescent phosphor layer being adhered to one side of said optically transparent sheet opposite to said sub-pixels, a transparent cover plate being disposed over the optically transparent sheet such that an air gap is formed between the optically transparent sheet and the transparent cover plate, with said at least one photoluminescent phosphor layer therebetween.

44. A pixel sub-structure according to claim 1, comprising at least two photoluminescent phosphor layers.

45. A pixel substructure according to claim 1, wherein the blue light emitting phosphor layer is combined with said thick film dielectric layer to provide a blue light of sufficient intensity to excite the photoluminescent layer to emit said other than blue colored light having a usable intensity.

46. A thick film dielectric electroluminescent display comprising:
pixels, each pixel comprising a thick film dielectric layer located between a first electrode and a second electrode and associated with a pixel sub-structure, said pixel sub-structure comprising:
at least two sub-pixels, each sub-pixel emitting blue light; and
at least one photoluminescent phosphor layer, each photoluminescent phosphor layer being associated with a respective one of said sub-pixels such that the blue light emitted by each respective one of said sub-pixels is substantially absorbed by the associated photoluminescent phosphor layer thereby causing said photoluminescent phosphor layer to emit a colored light other than the blue light.

47. A thick film dielectric electroluminescent display according to claim 46, wherein said pixel sub-structure comprises two sub-pixels and one photoluminescent phosphor layer.

48. A thick film dielectric electroluminescent display according to claim 46, wherein said pixel sub-structure comprises three sub-pixels and a first and a second photoluminescent phosphor layer, said first photoluminescent phosphor layer emits a colored light other than the blue light and said second photoluminescent phosphor layer emits a colored light other than the blue light and said colored light of said first photoluminescent phosphor layer.

49. A thick film dielectric electroluminescent display according to claim 46, wherein each sub-pixel comprises a blue light emitting electroluminescent phosphor layer and a viewing side electrode associated with said blue emitting electroluminescent phosphor layer; and each photoluminescent phosphor layer is associated with said viewing side electrode of said respective one of said sub-pixels.

50. A thick film dielectric electroluminescent display according to claim 49, comprising a plurality of photoluminescent phosphor layers, each photoluminescent phosphor layer being associated with a different one of said viewing side electrodes.

51. A thick film dielectric electroluminescent display according to claim 46, comprising a plurality of photoluminescent phosphor layers, each photoluminescent phosphor layer being associated with a different one of said sub-pixels.

52. A thick film dielectric electroluminescent display according to claim 46, wherein said sub-pixels comprise a blue light emitting electroluminescent phosphor layer.

53. A thick film dielectric electroluminescent display according to claim 52, wherein each of said sub-pixels comprise a viewing side electrode associated with said blue light emitting electroluminescent phosphor layer.

54. A thick film dielectric electroluminescent display according to claim 46, wherein each pixel comprises, in sequence:
a substrate;
said first electrode configured as a row electrode;
said thick film dielectric layer; and
said pixel sub-structure.

55. A thick film dielectric electroluminescent display according to claim 46, wherein the blue light emitting phosphor layer is combined with said thick film dielectric layer to provide a blue light of sufficient intensity to excite the photoluminescent layer to emit said other than blue colored light having a usable intensity.

56. A thick film dielectric electroluminescent display comprising:
pixels, each pixel comprising a thick film dielectric layer located between a first electrode and a second electrode and each pixel associated with a pixel sub-structure, said pixel sub-structure comprising:
at least two sub-pixels, each sub-pixel comprising a blue light emitting electroluminescent inorganic phosphor layer;
the second electrode configured as at least two viewing side electrodes associated with said blue emitting electroluminescent inorganic phosphor layer;
at least one photoluminescent phosphor layer, each photoluminescent phosphor layer being associated with a respective one of said viewing side electrodes such that the blue light emitted by said electroluminescent phosphor layer is substantially absorbed by said associated photoluminescent phosphor layer thereby causing said photoluminescent phosphor layer to emit a colored light other than the blue light.

57. A thick film dielectric electroluminescent display according to claim 56, wherein each pixel comprises, in sequence:

a substrate;

said first electrode configured as a row electrode;

said thick film dielectric layer; and said pixel sub-structure.

58. A thick film dielectric electroluminescent display according to claim 56, wherein the blue light emitting phosphor layer is combined with said thick film dielectric layer to provide a blue light of sufficient intensity to excite the photoluminescent layer to emit said other than blue colored light having a usable intensity.

\* \* \* \* \*